(12) United States Patent
Yamanobe

(10) Patent No.: US 6,900,487 B2
(45) Date of Patent: May 31, 2005

(54) WIRING LAYER STRUCTURE FOR FERROELECTRIC CAPACITOR

(75) Inventor: Tomomi Yamanobe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 163 days.

(21) Appl. No.: 09/893,487

(22) Filed: Jun. 29, 2001

(65) Prior Publication Data
US 2003/0001192 A1 Jan. 2, 2003

(51) Int. Cl.⁷ .......................... H01L 29/76; H01L 29/94; H01L 31/062; H01L 31/119
(52) U.S. Cl. ...................... 257/295; 257/310; 257/532; 257/306
(58) Field of Search ................................. 257/295, 310, 257/532, 306, 769; 438/3

(56) References Cited

U.S. PATENT DOCUMENTS

| | | | |
|---|---|---|---|
| 5,475,248 A | * 12/1995 | Takenaka | 257/295 |
| 5,481,490 A | * 1/1996 | Watanabe et al. | 365/145 |
| 5,841,160 A | * 11/1998 | Nakamura | 257/295 |
| 6,011,284 A | * 1/2000 | Katori et al. | 257/295 |
| 6,090,657 A | * 7/2000 | Yamoto et al. | 438/240 |
| 6,097,051 A | * 8/2000 | Torii et al. | 257/306 |
| 6,104,049 A | * 8/2000 | Solayappan et al. | 257/295 |
| 6,144,052 A | * 11/2000 | Kushida et al. | 257/295 |
| 6,165,802 A | * 12/2000 | Cuchiaro et al. | 438/3 |
| 6,174,766 B1 | * 1/2001 | Hayashi et al. | 438/241 |
| 6,249,014 B1 | * 6/2001 | Bailey | 257/295 |
| 6,448,649 B1 | * 9/2002 | Lee et al. | 257/758 |

FOREIGN PATENT DOCUMENTS

| | | | | |
|---|---|---|---|---|
| JP | 402105556 A | * 4/1990 | ........... | H01L/21/90 |
| JP | 403049229 A | * 3/1991 | ....... | H01L/21/3205 |
| JP | 405029255 A | * 2/1993 | ........... | H01L/21/28 |
| JP | 10-177991 | | 6/1998 | |
| JP | 410312999 A | * 11/1998 | ......... | H01L/21/312 |
| JP | 11-068048 | * 9/1999 | ........... | H01L/27/04 |

OTHER PUBLICATIONS

Merriam–Webster Online Dictionary , www.m–w.com.*
"Process Degradation of a Ferroelectric Capacitor", Tamura et al., Denshijouhou Tuusin Gakkai Ronbunsi C vol. J83–C No. 1, pp. 53–59 (2000).
"Protection of $Sr.Bi_2Ta_2O_9$ ferroelectric capacitors from hydrogen damage by optimized metallization for memory applications" Hong et al., Applied Physics Letters, vol. 77(1), Jul. 3, 2000, pp. 76–78, 2000 American Institute of Physics.

* cited by examiner

Primary Examiner—Mary Wilczewski
Assistant Examiner—Monica Lewis
(74) Attorney, Agent, or Firm—Venable LLP; James R. Burdett; Daniel G. Vivarelli, Jr.

(57) ABSTRACT

Wiring layers through that come into direct contact with an electrode of a ferroelectric capacitor provide a wiring layer structure configured so that the characteristic of the ferroelectric substance is not degraded by production of a reducing agent. One of coating layers through is provided on the periphery of the Al main wiring layer. A single Ti film or TiN film or a combination of both is used as the coating film. The TiN film suppresses reaction between water and aluminum. The Ti film occludes hydrogen. Therefore, the coating layer provided on the periphery of the Al wiring layer inhibits water or molecular hydrogen from entering the Al wiring layer from the outside and therefore there is no degradation of the characteristics of the ferroelectric capacitor.

13 Claims, 12 Drawing Sheets

WIRING LAYER STRUCTURE FOR FERROELECTRIC CAPACITOR

BACKGROUND OF THE INVENTION

1. Field of the Invention

The present invention relates to a semiconductor storage element that uses a ferroelectric substance, and more particularly to a wiring layer structure for a ferroelectric capacitor.

2. Description of Related Art

Ferroelectric storage that uses ferroelectric material as the material for the capacitor is now reaching a stage for practical use as a type of non-volatile device. It is expected that memory devices equipped with ferroelectric capacitors will require low voltage, will have low power consumption, and will operate at high speeds because of the characteristics of this ferroelectric material. However, solutions to a number of problems are required before capacitor configurations that include ferroelectric materials can be applied in conventional semiconductor devices.

One of these problems is the degradation of the characteristics of thin ferroelectric films by hydrogen. Many of the ferroelectric materials that have been examined for application in memory are oxides of a multiplicity of elements. Typical such metal oxide materials include $SrBi_2Ta_2O_9$ (abbreviated to SBT), and $Pb(Zr, Ti)\ O_3$. After formation of a ferroelectric capacitor configuration using these materials, if activated hydrogen (hydrogen radical: H*) or molecular hydrogen ($H_2$) is activated during the processes that complete a semiconductor device, these hydrogen radicals reduce the oxygen in the ferroelectric material and therefore the oxygen in the thin ferroelectric film. This reduction causes degradation of the characteristics of the ferroelectric material in the thin ferroelectric film.

One method used to combat this degradation in characteristics is recovery annealing in oxygen at a temperature at which the ferroelectric substance crystallizes, that is at a temperature between 700° C. and 800° C. Another method used is the formation of a barrier metal around the capacitor structure itself to prevent the infiltration (or entering) of activated hydrogen or molecular hydrogen into the thin ferroelectric film.

However, when semiconductor devices that include these memory devices are integrated or consolidated, a process to form wiring that is connected to the capacitor of the memory device is implemented. This wiring material is usually aluminum. Therefore, after the capacitor structure is formed, annealing at temperatures of 700° C. and above, as described above, cannot occur.

Also, for example, Document 1, *Densijouhou Tuusin Gakkai Ronbunsi C* Vol. J83-C No. 1 pp. 53–59 (2000), discloses an example in which aluminum (Al) wiring is formed in the capacitor structure and an inter-layer insulation film, made of an ozone TEOS film (oxide film) is formed on the upper side of this wiring.

The document points out that:
(a) The ozone TEOS film produces large quantities of moisture;
(b) The moisture produced produces hydrogen when it oxidizes the Al;
(c) This hydrogen degrades the characteristics of the thin ferroelectric layer; and
(d) This degradation can be reduced by using a TiN (titanium nitride) layer on the Al wiring substrate since the addition of this TiN causes less hydrogen to be produced than when Al alone is used. This is because TiN oxidizes more than Al.

Also, Document 2, Japanese Patent Application Laid-open No: 10-177991, discloses a semiconductor device configured so that the Al or Al radical alloy wiring layer, formed on a titanium nitride (TiN) film, which is the barrier metal, does not corrode. According to this Document 2, ion sputtering of this insulation film is carried out on the side wall of a wiring structure created by laminating layers of titanium nitride, Al or an Al radical alloy, and titanium nitride on this insulation film, which is made for example from silicon dioxide. This forms a corrosion protection film (sputter material film) that prevents infiltration (or entering) of moisture from the outside onto the Al or Al radical alloy.

However, neither Document 1 nor Document 2 disclose or suggest a wiring layer structure or formation method thereof that can be applied in a wiring layer (or interconnection layer) that comes into direct contact with the electrodes of the ferroelectric capacitor.

Accordingly, there has been a demand for some means of preventing the degradation of the characteristics of a thin ferroelectric film caused by the wiring after such contact wiring is formed.

SUMMARY OF THE INVENTION

A first object of the present invention is to provide a wiring layer structure configured so that the wiring layer does not damage the thin ferroelectric film in the ferroelectric capacitor.

A second object of the present invention is to provide a wiring layer structure configured so that the wiring layer that comes into direct contact with the electrodes on a ferroelectric capacitor does not produce a reducing agent that will degrade the characteristics of the ferroelectric substance.

To achieve these objects, the wiring layer structure of the present invention shall be a laminated structure in which a main wiring layer formed from a first material is surrounded on the outside by a coating layer formed from a second material. This laminated structure shall be provided at least in the wiring layer part of the wiring layer structure that comes into contact with one electrode in the ferroelectric capacitor.

This first material shall be a material, preferably aluminum (Al), that reacts with a substance that infiltrates (or enters) from the outside into the main wiring layer and produces a reducing agent. This first material shall be used to configure a wiring layer that is electrically continuous from the capacitor electrode and it shall therefore be, of course, electrically conductive.

The second material shall be an electrically conductive material, preferably titanium (Ti) or titanium nitride (TiN), that can prevent the infiltration (or entering) of a substance that causes the reaction as described above from the outside.

A laminated structure created from layers of these first and second materials will prevent water molecules ($H_2O$) or molecular hydrogen ($H_2$) from infiltration (or entering) into the main aluminum wiring layer. Therefore, a reducing agent is not produced in the aluminum. Accordingly, because there is no risk of infiltration of a reducing agent from the wiring layer into the capacitor, the ferroelectric substance within the capacitor is not damaged and its characteristics are not degraded.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

Figure 1:
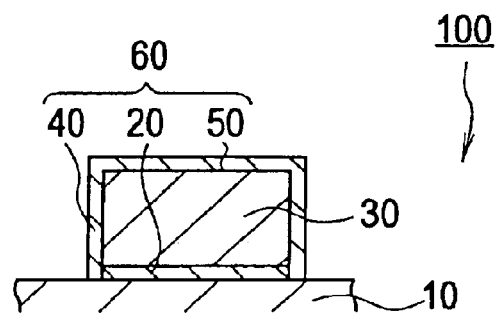
FIG. 1 is a cross-section that shows a schematic view of the structure of a first embodiment of the wiring layer structure according to the present invention.
Figure 2:
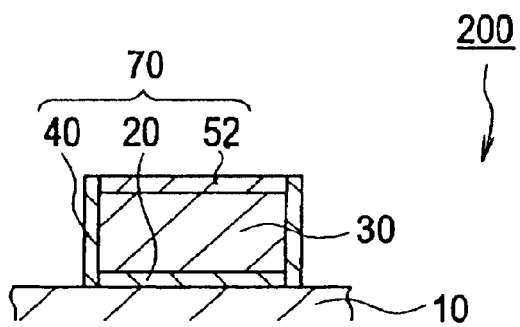
FIG. 2 is a cross-section that shows a schematic view of the structure of a second embodiment of the wiring layer structure according to the present invention.
Figure 3:
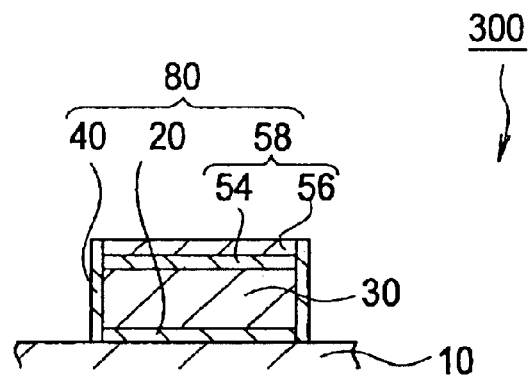
FIG. 3 is a cross-section that shows a schematic view of the structure of a third embodiment of the wiring layer structure according to the present invention.
Figure 4:
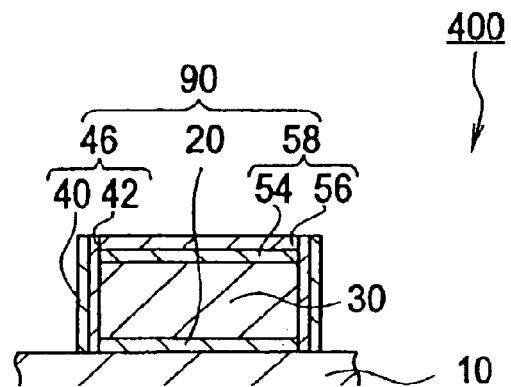
FIG. 4 is a cross-section that shows a schematic view of the structure of a fourth embodiment of the wiring layer structure according to the present invention.

Below, aspects of the embodiments of the present invention will be explained with reference to the diagrams. The diagrams simply overview the size and shape of, and positional relationships between components so that the present invention can be understood. Accordingly, the present invention is not limited to the examples shown in the diagrams. Also, the materials, numerical conditions, and process conditions explained below are merely examples, and the present invention is not limited to these conditions.

Explanation of the Wiring Configuration

FIGS. 1 through 4 are cross-sections that show configuration examples that correspond to first through fourth embodiments of the wiring layer structure of the present invention.

In all the configuration examples shown in FIGS. 1 through 4, the wiring layer structures 100, 200, 300, and 400, come into contact with an electrode 10 of the ferroelectric capacitor. The wiring layer is also called as an interconnection layer.

The wiring layer structures 100, 200, 300 and 400 each comprise a main wiring layer 30, and a coating layer 60, 70, 80, or 90 that surrounds the outer periphery of the main wiring layer 20.

The main wiring layer 30 comprises a first material that produces a reducing agent that reacts with a substance that infiltrates (or enters) from the outside into this main wiring layer 30. Also, each of the coating layers 60, 70, 80 and 90 is made from a second material that prevents the infiltration (or entering) of a substance that infiltrates from the outside into the main wiring layer 30. The first and second materials are conductive.

Typical examples of substances that can be expected to infiltrate from the outside into the main wiring layer 30 are water ($H_2O$) and hydrogen ($H_2$). Also, typical examples of reducing agents are the hydrogen radical ($H^*$) and hydrogen ($H_2$).

It is preferable to use aluminum (Al) as the first material. It is preferable to use titanium nitride (TiN) and/or titanium (Ti) as the second material. TiN is ideal because it prevents any reaction between water and aluminum. On the other hand, Ti has a hydrogen occlusion property and so is ideal for use as a hydrogen barrier layer.

These coating layers 60, 70, 80, and 90 are formed on the surface of those parts of wiring layer structures 100, 200, 300, and 400 that come into contact with at least electrode 10. These parts are areas within the main wiring layer in which the reducing agent that is likely to be produced in the main wiring layer could affect the electrode. Accordingly, the part within the main wiring layer up to which the coating layer is provided is determined as appropriate in accordance with the design.

Usually, the cross-sectional form of the contact part of this main wiring layer is basically that of the letter T. The cross-sectional form of the part that extends to the interlayer insulation film is basically rectangular.

The coating layers 60, 70, 80, and 90 comprise: a first coating part 20 provided between the main wiring layer 30 and the electrode 10; a second coating part 50, 52, or 58, provided on the surface of the side opposite the ferroelectric capacitor of this main wiring layer 30; and a third coating part 40 or 46 provided on the side surface of this main wiring layer 30.

The coating layers 60, 70, 80, and 90 can be of any thickness to suit the design of each of the embodiments.

Configuration examples for the first through fourth embodiments of the present invention will be explained below, in order, with reference to FIGS. 1 through 4. FIGS. 1 through 4 are all cross-sections and in all, the contact hole part has been omitted.

Configuration of a First Embodiment

Firstly, a first embodiment of the present invention will be explained. In the wiring layer structure 100 for the first embodiment shown in FIG. 1, a main wiring layer 30 is formed on the upper side of one electrode (this shall be the first electrode) 10 in a ferroelectric capacitor. This main wiring layer 30 is an aluminum (Al) wiring layer. A coating layer 60 is provided on the outer periphery of this aluminum wiring layer 30.

This coating layer 60 has first, second, and third coating parts. The first coating part 20 is the part that lies between the part provided on the bottom surface of the aluminum wiring layer 30, that is the aluminum wiring layer 30, and the first electrode 10. The second coating part 50, 52, or 58 is the part provided on the surface of the side opposite the first electrode 10 of the part provided on the top surface of the aluminum wiring layer 30, that is the aluminum wiring layer 30. The third coating layer 40 is the part provided on the side surface of the aluminum wiring layer.

In this configuration example for the first embodiment, the first, second, and third coating parts are configured using a TiN film. In particular, the first coating part 20 is a TiN film formed using the sputtering technique. The second and third coating parts 40 and 50 are TiN films formed using chemical vapor deposition (CVD).

In the configuration of the first embodiment described above, the surface of the aluminum wiring layer is coated with a TiN film. Therefore, this TiN film can prevent any reaction between water or molecular hydrogen and the surface of the aluminum wiring layer. Accordingly, no reducing agent is produced in the aluminum wiring layer.

Configuration of a Second Embodiment

Next, a second embodiment of the present invention will be explained. The wiring layer structure 200 in the second embodiment shown in FIG. 2 differs from the structure of the wiring layer of the first embodiment in that a coating layer 70 is provided on the outer periphery of the aluminum wiring layer 30.

The second coating part 52 of this coating layer 70 is different to the second coating part 50 of the coating layer 60. The second coating part 52 in this second embodiment is a TiN film formed using the sputtering technique. Other parts are the same as those shown in the configuration example for the first embodiment and so explanation of these will be omitted here.

In the configuration of the second embodiment as described above, the surface of the aluminum wiring layer is coated with a TiN film. Therefore, this TiN film can prevent any reaction between water or molecular hydrogen and the surface of the aluminum wiring layer. Accordingly, no reducing agent is produced in the aluminum wiring layer.

Configuration of a Third Embodiment

Next, a third embodiment of the present invention will be explained. The wiring layer structure 300 of the third embodiment shown in FIG. 3 differs from the wiring layer structures of the first and second embodiments in that a coating layer 80, which includes a Ti film that occludes hydrogen on the upper surface of the aluminum wiring layer 30, is provided on the outer periphery of the wiring layer 30.

The second coating part 58 of this coating layer 80 is different to the second coating parts 50 and 52 of coating layers 60 and 70. The second coating part 58 in this third embodiment, is of a built-up layer structure with two layers: a first sub-coating part 54 and a second sub-coating part 56. The lower layer (the base layer) formed on the upper surface of the aluminum wiring layer 30, that is the first sub-coating part 54, is a Ti film formed using the sputtering technique. The upper layer, that is the second sub-coating part 56, is a TiN film formed using the sputtering technique. Other elements of the configuration are the same as those in the first and second embodiments and so explanation of these will be omitted here.

In the configuration of the third embodiment described above, the surface of the aluminum wiring layer is coated with a TiN film. This TiN film can prevent any reaction between water or molecular hydrogen and the surface of the aluminum wiring layer. Also, the upper side of the aluminum wiring layer is also coated with a Ti film and this can prevent any reaction between hydrogen and the surface of the aluminum wiring layer. Accordingly, a reducing agent is not produced in the aluminum wiring layer.

Configuration of a Fourth Embodiment

Next, a fourth embodiment of the present invention will be explained. The wiring layer structure 400 of the fourth embodiment shown in FIG. 4 differs from the wiring layer structures of the first, second, and third embodiments in that a coating layer 90, which includes a Ti film, is provided on both the upper and side surfaces of the aluminum wiring layer 30.

The second coating part 58 of this coating layer 90 is configured in the same way as in the third embodiment but is different to the second coating part 50 and 52 of the coating layers 60 and 70 in the first and second embodiments. Being a two-layer built-up film structure, the third coating part 46 of this fourth embodiment differs from the single layer structure of the third coating part 40 in the first, second, and third embodiments. This third coating part 46 comprises: the inside layer formed on the side surface of the aluminum wiring layer 30, that is a third sub-coating part 42; and an outside layer formed on the top side of this inside layer 42, that is a fourth sub-coating part 44.

In the configuration example for this fourth embodiment, the fact that the main wiring layer is coated by a Ti film is different to the configuration for the third embodiment. That is, in this configuration example, the inside layer in the configuration of the third embodiment is a Ti film formed using CVD, and the outside layer 44 is a TiN film formed using CVD.

In the configuration of the fourth embodiment described above, the surface of the aluminum wiring layer is coated with a TiN film. Therefore, this TiN can prevent any reaction between water or molecular hydrogen and the surface of the aluminum wiring layer. Also, the upper and side surfaces, but not the bottom surface, of the aluminum wiring layer are also coated with Ti film and so this can prevent reaction between water and the surface of the aluminum wiring layer. Accordingly, any production of a reducing agent within the aluminum wiring layer can be inhibited more completely than in the third embodiment.

Explanation of Forming Methods for Wiring Layer Structures

Next, the forming methods for the wiring configurations for the present invention will be explained with reference to the process drawings shown as cross-sections in FIGS. 5 through 8. Note that in these diagrams, hatching to show that the diagrams are cross-sections is omitted.

Figure 5A:
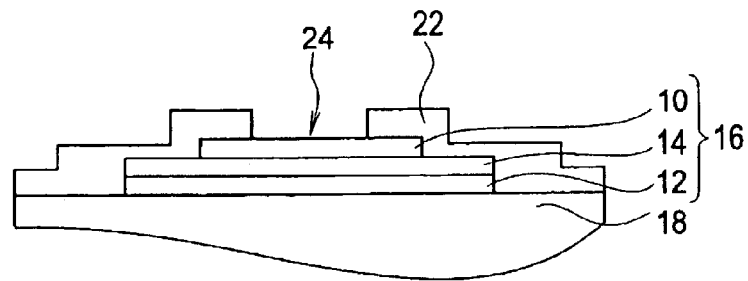
FIG. 5 (including FIGS. 5(A) through 5(G)) shows the processes involved in the formation of the structure of a first aspect of the embodiment of the wiring layer structure of the present invention.
Figure 6A:
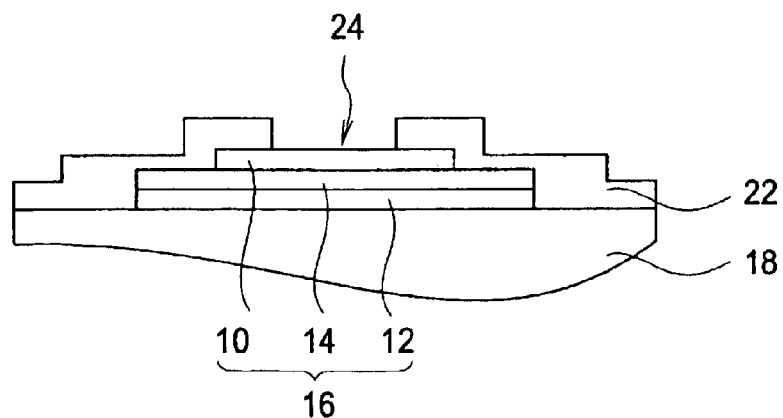
FIG. 6 (including FIGS. 6(A) through 6(F)) shows the processes involved in the formation of the structure of a second aspect of the embodiment of the wiring layer structure of the present invention.
Figure 6B:
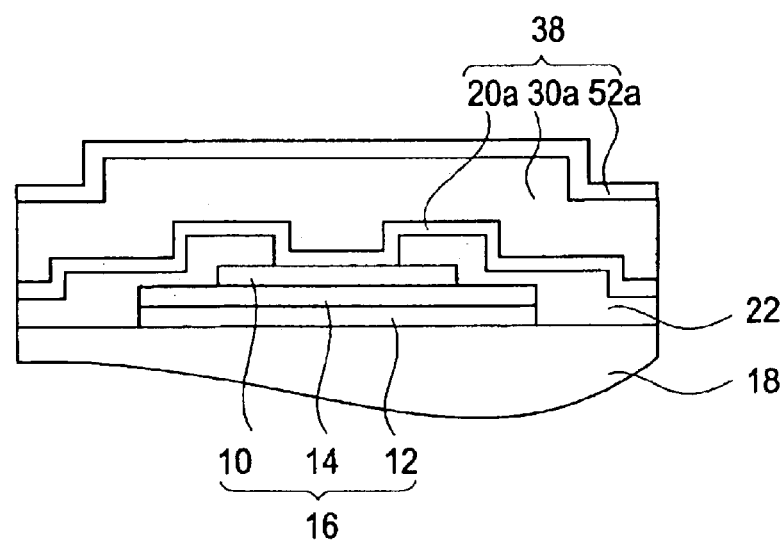
Figure 6C:
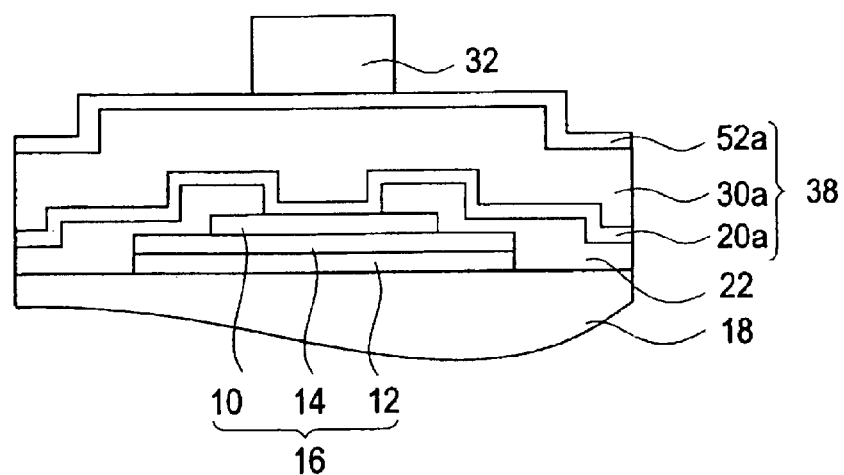
Figure 6D:
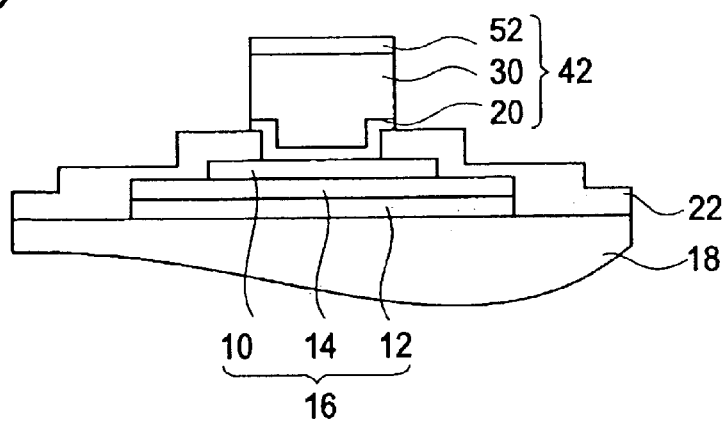
Figure 6E:
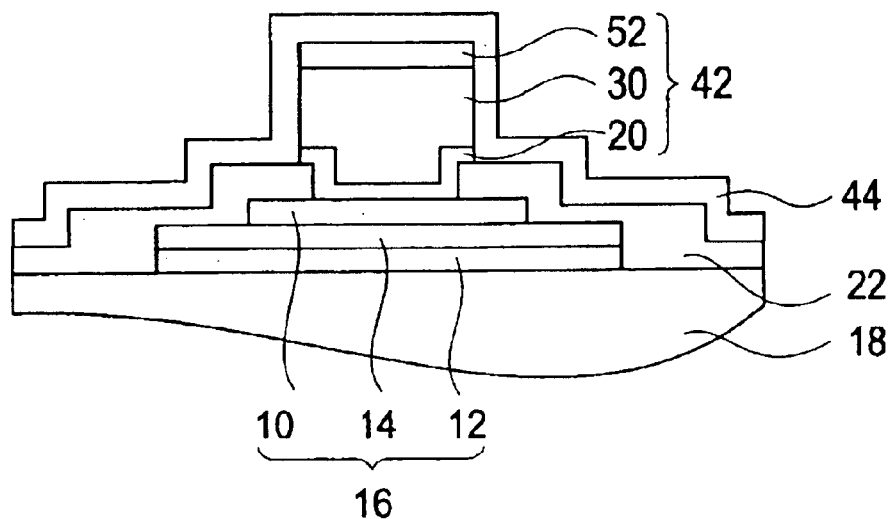
Figure 6F:
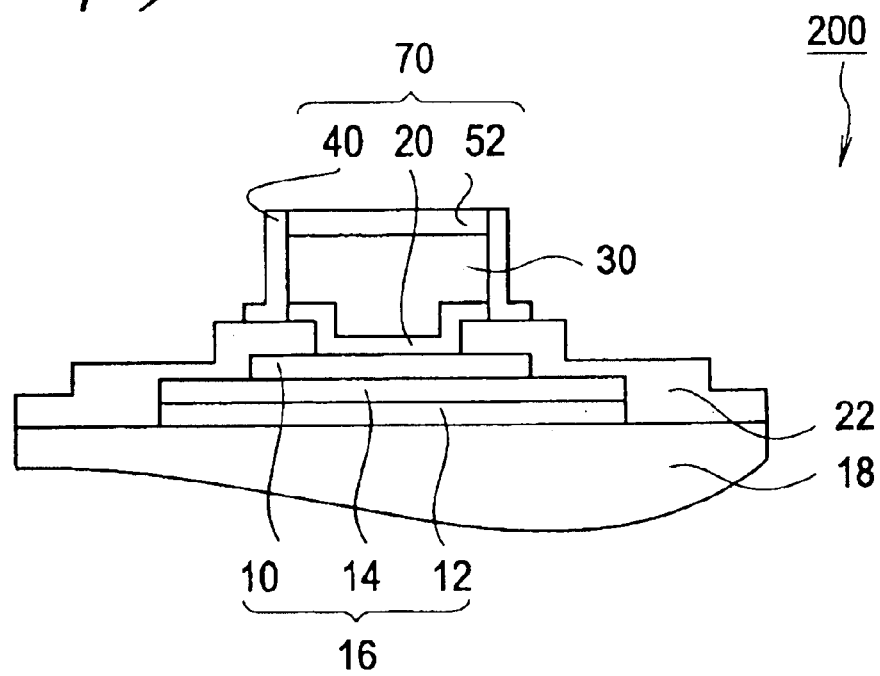
Figure 7A:
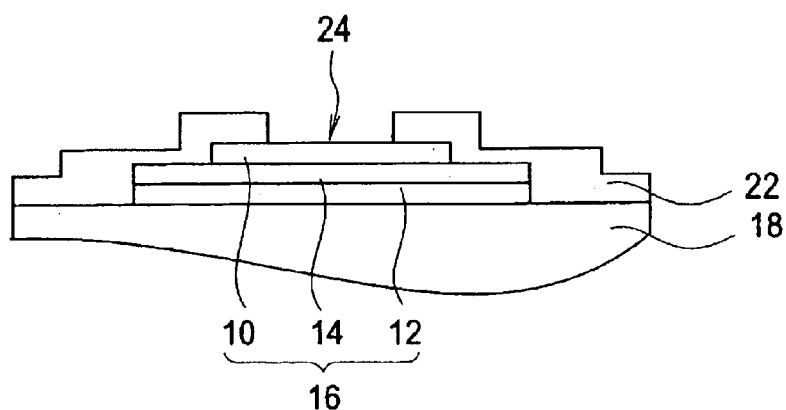
FIG. 7 (including FIGS. 7(A) through 7(F)) shows the processes involved in the formation of the structure of a third aspect of the embodiment of the wiring layer structure of the present invention.

FIGS. 5(A), 6(A), and 7(A) each show the structure in which the ferroelectric capacitor for starting this process is formed. This structure is formed before the procedure for forming this wiring layer structure is started. That is, the ferroelectric capacitor 16 is formed on the substrate 18, on which the desired semiconductor area will be formed, using an appropriate conventional method. The electrode on the substrate side of the ferroelectric capacitor 16 (hereinafter referred to as the second electrode) is shown as 12 and the ferroelectric material, that is the ferroelectric layer, is shown as 14. In the embodiments explained below, platinum (Pt) is used as the material for the first and second electrodes 10 and 12 and SBT is used as the ferroelectric material 14. However, these materials are not restricted to those described here. The interlayer insulation film 22 can be formed of any suitable material. This preparation is the same for all the configuration examples shown in FIGS. 6 through 8.

Forming Method for the Configuration of the First Embodiment

Firstly, the method for forming the wiring layer structure for the first embodiment described above will be explained with reference to FIGS. 5(A) through 5(G).

In this forming method, the first and second resist patterns are formed using different light exposures but the same resist material. These resist patterns are used as etching masks and a coating film is formed on the required outside surfaces of the main wiring layer.

Figure 5B:
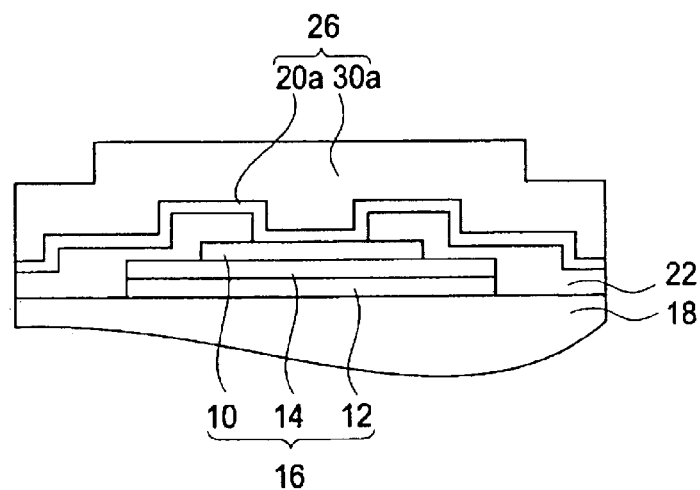
Figure 5C:
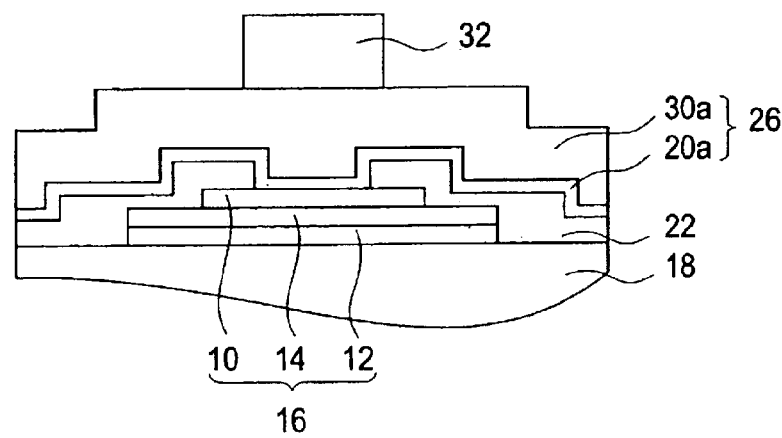
Figure 5D:
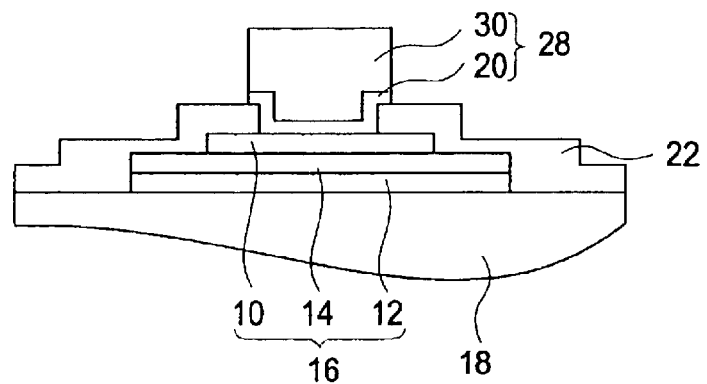

In the first process, firstly a first built-up layer 28 is formed (FIG. 5(D)) from the main wiring layer 30 and a first coating part 20 on the surface of the side opposite the ferroelectric layer 14 of the first electrode 10.

Next, in the second process, a second coating part is formed on the surface of the side opposite the first coating part 20 of the first built-up layer 28. In addition, a third coating part is formed on the side surface of the first built-up layer 28. The first, second, and third coating parts 20, 50, and

Figure 5E:
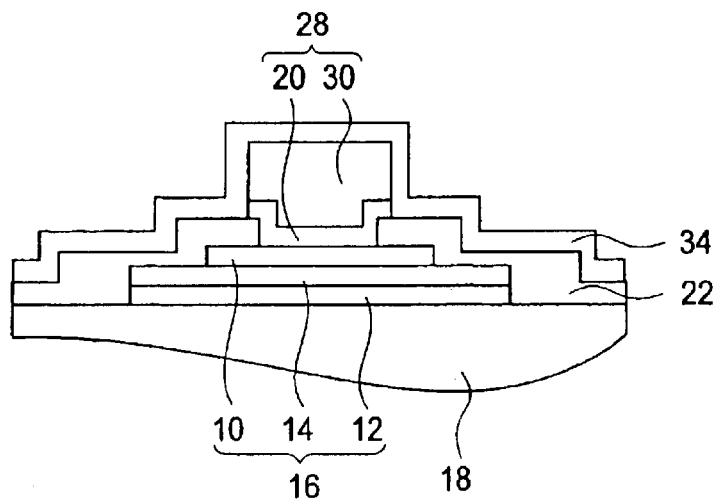
Figure 5F:
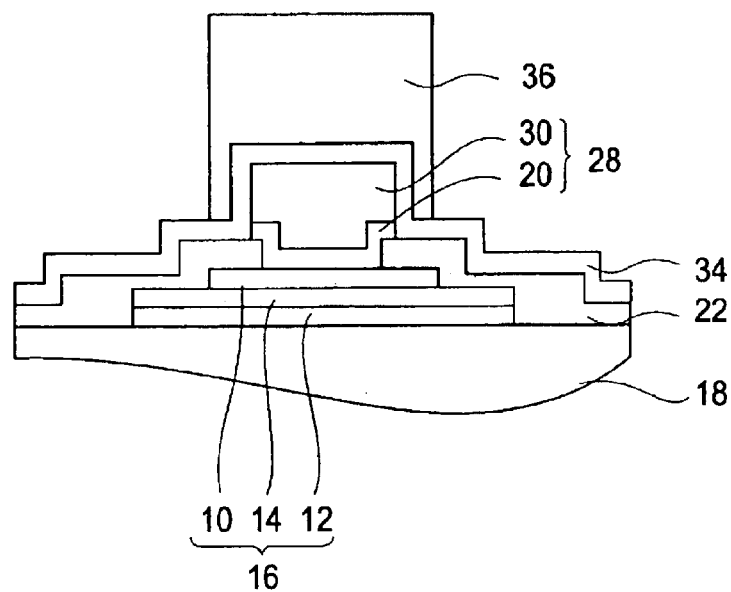
Figure 5G:
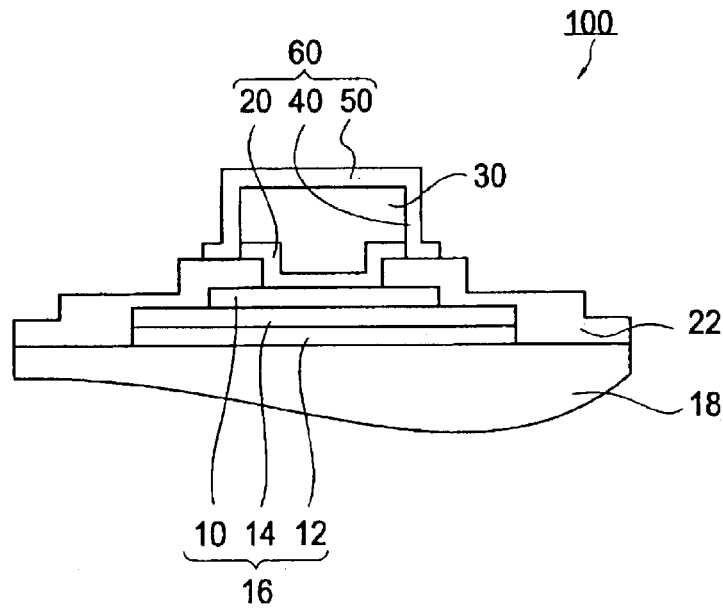

40 thus formed are joined together to form the coating layer 60 that coats the main wiring layer 30 (FIG. 5(G)).

In this first process, the following first through fourth sub-processes are implemented to form this main wiring layer 30 and the coating layer 60 that coats it. Furthermore, in the second process, the following fifth through seventh sub-processes are implemented.

Firstly, a preferable example of the first process will be explained. In the first sub-process, an interlayer insulation film 22, on which contact holes 24 for exposing part of the first electrode 10 are provided, is formed (FIG. 5(A)). In this embodiment too, the commonly used TEOS film is formed as this interlayer insulation film 22. Here, in a preferable example, a laminated film is formed with a 100 nm thick $O_3$-TEOS layer and a 300 nm thick P-TEOS layer. The conditions for the formation of these films are as described below. The conditions required for the $O_3$-TEOS film are: TEOS flow rate of 2 SLM (=2,000 sccm); an $O_3$ concentration of 25 $g/cm^3$; and a temperature of 400° C. The conditions required for the P-TEOS film are: a TEOS flow rate of 240 sccm; an $O_3$ flow rate of 560 sccm; power of 390 W; and a temperature of 390° C.

Next, in the second sub-process, an auxiliary built-up layer 26, comprising a first auxiliary coating layer 20*a* and an auxiliary main wiring layer 30*a* which are laid down sequentially, is formed on the upper side of the interlayer insulation film 22 to fill in these contact holes 24 (FIG. 5(B)). This first auxiliary coating layer 20*a* is, for example, formed as a titanium nitride (TiN) film using sputtering that targets TiN. Also, the auxiliary main wiring layer 30*a* is, for example, formed as an aluminum (Al) film using sputtering that targets Al. In particular, this auxiliary main wiring layer 30*a*, is best formed so that its upper surface is essentially flat in order to avoid unevenness in the upper surface of the wiring layer.

Prefereable examples of the conditions required for this sputtering are given below. The conditions required for the TiN film are: a film depth of 50 nm; pressure of 4 mTorr (approximately 0.532 Pa); and power of 6 kW. This TiN film is formed without heating, that is at room temperature. The conditions required for the Al are: a film depth of 300 nm; pressure of 2 mTorr (approximately 0.226 Pa); power of 12 kW; and a temperature of 250° C. In the formation of both the TiN and Al films, argon is used as the ion for injection in sputtering.

Next, in the third sub-process, photolithography is used to form a first resist pattern 32 on the auxiliary built-up layer 26 (FIG. 5(C)). A preferable example of the resist material to be used here is, for example, IPI1800-9 cp (manufactured by TOKYO OHKA KOGYO CO., Ltd.) a product that is readily available on the market. Any other suitable material can be used. When using a bought resist material such as this, it is preferable that the depth of the resist film is 1,200 nm.

Figure 9:
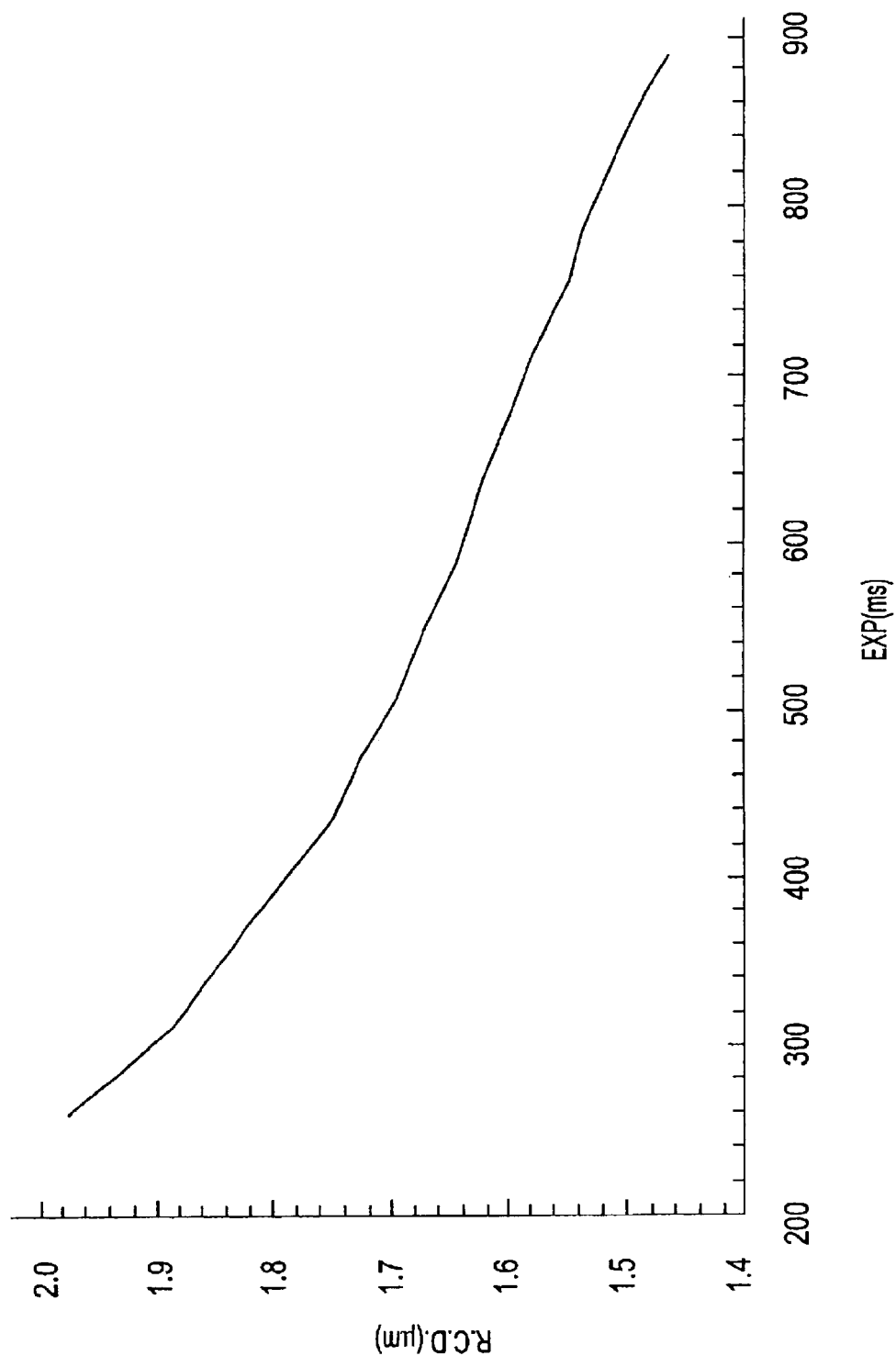
FIG. 9 illustrates the light exposure characteristics of the resist used in the present invention.

FIG. 9 explains the exposure characteristic of resist. It shows the relationship between the resist light exposure and the pattern dimensions for the IPI1800-9 cp resist. In FIG. 9, the horizontal axis shows the light exposure (EXP (ms)) and the vertical axis shows the pattern dimensions (R.C.D. ($\mu$m)). This characteristic curve shows that large resist pattern dimensions result when the light exposure time is short and that smaller pattern dimensions result when the light exposure time is long. Note however, that here, when the light exposure is too long, the resist angles become rounded and when the light exposure is too short, a pattern cannot be formed. In later processes, in light of the fact that patterning using the same resist material will be implemented, an 800 ms light exposure is used for a 1,200 nm thick resist layer. This forms this first resist pattern 32 that has a pattern width of 1.5 $\mu$m.

Next, the fourth sub-process is implemented. The auxiliary built-up layer 26 is etched to form the first laminated layer 28 (FIG. 5(D)). Here, the first mask pattern 32 is used as a mask and anisotropic etching of the Al film 30*a* and the TiN film 20*a* is implemented one after the other. This forms, in suitable shapes and sizes, an Al wiring layer 30, as the main wiring layer, and a TiN sputter layer 20, as the first coating part. The first resist pattern 32 is then removed in an appropriate manner.

Here, etching is done in a mixed atmosphere of $Cl_2$ and $BCL_3$. The reason why B is included is to prevent any products of etching from adhering to the side wall of the pattern of the first built-up layer 28. The conditions required for etching are: a $BCL_3$ flow rate of 60 sccm; a $Cl_2$ flow rate of 90 sccm; pressure of 7 mTorr (approximately 0.931 Pa); and power of 80 W.

Next, a preferable example of the second process will be explained.

The fifth sub-process is implemented to form a second auxiliary coating layer 34 on the interlayer insulation film 22 that includes the first built-up layer 28 (FIG. 5(E)). This second auxiliary coating layer 34 is formed using TiN CVD. This TiN CVD film 34 is formed using hot CVD with a gas mixture of $TiCL_4$, $N_2$, and $NH_3$. The conditions for this film formation are: a film depth of 50 nm; a $TiCL_4$ flow rate of 35 sccm; an $N_2$ flow rate of 470 sccm; an $NH_3$ flow rate of 400 sccm; pressure of 0.4 Torr (approximately 53.2 Pa); and a temperature of 680° C. CVD is used because it is better able than sputtering to form a TiN film 34 of a uniform thickness on both the flat surfaces and the side surfaces (that is perpendicular surfaces) of the first built-up layer 28.

Next, the sixth sub-process is implemented to form a second resist pattern on the upper side of this first built-up layer 28 (FIG. 5(F)). Here, the same resist material used for the first resist pattern 32 is used for a second resist pattern 36 but a resist pattern of slightly larger dimensions than the first resist pattern 23 is formed. As previously explained with reference to FIG. 9, this second resist pattern is formed using the exposure characteristic of the resist material.

In this configuration example, this second resist pattern 36 is formed so that it protrudes right up to the outside of the first built-up layer 28. Therefore, in this embodiment, the resist is exposed for a short time of just 400 ms to form a wider pattern of width 1.8 $\mu$m. By thus forming a second resist pattern 36, when the film thickness of the CVD-TIN film 34 is 50 nm, a margin of 100 nm or more can be taken on the side surfaces.

When forming the third coating part 40 on the side wall, the stepper alignment precision that forms the second resist pattern 36 is normally about 0.2 $\mu$m. Therefore, it is preferable that the above margin be at least 0.3 $\mu$m.

Next, the seventh sub-process is implemented to etch the TiN CVD film 34, which is the second auxiliary coating layer, and to form a second and third coating part 50 and 40 (FIG. 5(G)). Etching here is done in the same way as etching for the first auxiliary coating film layer 20*a*, using the second resist pattern 36. In other words, this etching is done in a mixed atmosphere of $Cl_2$ and $BCl_3$. The conditions for this etching are: a $BCl_3$ flow rate of 60 sccm; a $Cl_2$ flow rate of 90 sccm; pressure of 7 mTorr (approximately 0.931 Pa), and power of 80 W.

The cross-sectional structure of the wiring layer structure formed thus and shown in FIG. 5(G) is in the shape of an upper case letter T. Although the shape is different, it has the exactly the same type of layer structure as explained in FIG. 1. The second resist pattern can then be removed in an appropriate manner.

Thus, the wiring layer structure 100, which is connected to the electrode of the ferroelectric capacitor and which has a coating layer 60 around the main wiring layer 30 as required, is obtained.

Thus, in the method for forming the wiring layer structure of the first embodiment of the present invention, the first resist pattern 32, formed to the required width by increasing the exposure, is used to etch and thereby form the main wiring layer 30 and the first coating part 20 beneath it. Next, after the TiN film 34 is formed, the second resist pattern 32, which is made wider by reducing the light exposure, is used to etch and thereby form the second and third coating parts 50 and 40. Therefore, a TiN coating layer 60 can be accurately formed all around any part of the Al main wiring layer 30 that could be exposed, without necessitating a special mask for processing.

Forming Method for the Configuration of the Second Embodiment

Next, the method for forming the wiring layer structure for the second embodiment explained above will be explained with reference to FIGS. 6(A) through (F).

In the forming method, in the first process, a first built-up layer 42, comprising a first coating part 20, a main wiring layer 30, and a second coating part 52, is formed on the surface opposite the ferroelectric layer 14 of the first electrode 10 (FIG. 6(D)).

Next, in the second process, a third coating part 40 is formed on the side surface of the first built-up layer 42 then a coating layer 70, which coats the main wiring layer 30 with first, second, and third coating parts 20, 52, and 40, is formed.

To form this main wiring layer 30 and the coating layer 70 that coats it, the following first through fourth sub-processes are implemented in this first process. Furthermore, the following fifth and sixth sub-processes are implemented in the second process.

Firstly, a preferable example of the first process will be explained. In the first sub-process, an interlayer insulation film 22 with contact holes for exposing part of the first electrode 10 is formed with a TEOS film (FIG. 6(A)) using the same materials and film forming conditions as in the forming method for the first embodiment.

Next, in the second sub-process, an auxiliary built-up layer 38, in which a first auxiliary coating layer 20a, an auxiliary main wiring layer 30a, and a second auxiliary coating layer 52a are laid down sequentially, is formed on the top side of the interlayer insulation film 22 (FIG. 6(B)). This first auxiliary coating layer 20a and auxiliary main wiring layer 30a are formed with the same materials and under the same film forming conditions as in the forming method for the first embodiment. Also, the second auxiliary coating layer 52a is a TiN sputter film and is formed using the same materials and under the same film forming conditions as used for the first auxiliary coating layer 20a.

Next, in the third sub-process, the photolithography technique is used to form a first resist pattern 32 on the auxiliary built-up layer 38 (FIG. 6(C)). The resist material used here is the same resist material as used in the forming method for the first embodiment. This first resist pattern 32 is formed under photolithography conditions.

Next, the fourth sub-process is implemented to etch the auxiliary built-up layer 38 and form the first built-up layer 42 (FIG. 6(D)). Here, as in the forming method for the first embodiment, the first mask pattern 32 is used as a mask to sequentially etch the TiN film 52a, the Al film 30a, and the TiN film 20a. The TiN sputter film 52, which is the second coating part, the Al wiring layer 30, which is the main wiring laye, and the TiN sputter film 20, which is the first coating part, are then all formed into suitable shapes and sizes. Here, the etching of the TiN films and Al film is done under the same etching conditions and using the same gas as used in the forming method for the first embodiment. The first resist pattern is then moved in an appropriate manner.

Next, a preferable example of the second process will be explained.

In the fifth sub-process, a third auxiliary coating layer 44 is formed on the interlayer insulation film 22 that includes the first built-up layer 42 (FIG. 6(E)). This third auxiliary coating layer 44, is formed in the same way as the second auxiliary coating layer 34 in the forming method for the first embodiment, using TiN CVD technique and film forming conditions. In this CVD, a TiN film of uniform depth can be formed on the upper and side surfaces of the first built-up layer.

Next, in the sixth sub-process, anisotropic etching of a third auxiliary coating layer 44 is done in a perpendicular direction. This exposes the top surfaces of both the second coating part 52 and the interlayer insulation film 22, and also forms the third coating part 40 (FIG. 6(F)). Dry etching is used here and all surfaces are etched back from the third auxiliary coating layer 44 side. The dry etching of the TiN film formed using CVD is done in the same gas environment as used in the etching of the forming method for the first embodiment and under the same etching conditions. Therefore, the third auxiliary coating layer 44 on the side of the first built-up layer 42 is not removed in this etching and coating layer 70 can be obtained.

Thus, a wiring layer structure 200, which is connected to the electrode of the ferroelectric capacitor and which has a coating layer 70 around the required parts of the main wiring layer 30, is obtained.

Thus, in the forming method for the wiring layer structure of the second embodiment of the present invention, firstly a first built-up layer 42, in which TiN film is laminated above and below layer 30, is formed. A new TiN film 44 is then provided from the top of this first built-up layer 42 over all surfaces of the interlayer insulation film 22. Dry etching of this TiN film 44 is implemented to etch back all surfaces and thus obtain the wiring layer structure.

Therefore, the TiN film is removed by etching from the upper part of the main wiring layer and from parts in surrounding areas. However, it is not removed from the part of the third auxiliary coating layer 44, formed on the side of the first built-up layer 42 in a direction perpendicular to the substrate surface. This fact enables simplification of the lithography process and means that a coating layer can be formed accurately on the required surfaces around the main wiring layer.

Forming Method for the Configuration of the Third Embodiment

Next, the forming method for the wiring layer structure of the third embodiment described above will be explained with reference to FIGS. 7(A) through (F).

In this forming method, firstly, the first and second processes differ from the first and second processes explained with reference to FIG. 6 above only in part and so the sub-processes for both processes will be explained.

In this first process, the following first through fourth sub-processes are implemented to form this main wiring layer 30 and the coating layer 80 that covers it. Furthermore, in the second process, a fifth and sixth sub-process are implemented.

Firstly, a preferable example of the first process will be explained. In the first sub-process, an interlayer insulation film 22, with contact holes 24 for exposing part of the first electrode 10, is formed using TEOS film and using the same materials and film forming conditions as used in the forming method for the first embodiment (FIG. 7(A)).

Figure 7B:
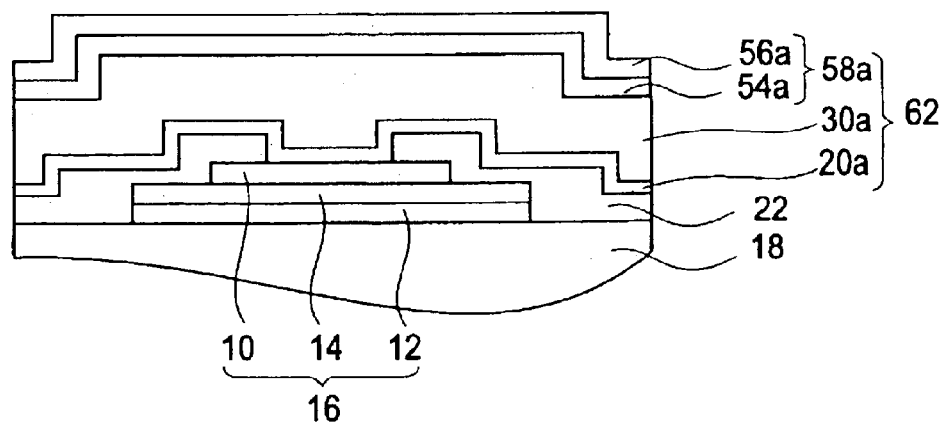

Next, in the second sub-process, an auxiliary built-up layer 62, in which a first auxiliary coating layer 20a, an auxiliary main wiring layer 30a, a first auxiliary sub-coating layer 54a, and a second auxiliary sub-coating layer 56a are laid down sequentially, is formed on the upper side of the interlayer insulation film 22 (FIG. 7(B)). In this configuration example, a second auxiliary coating layer 58a is formed by a first auxiliary sub-coating layer 54a and a second auxiliary sub-coating layer 56a. Also, in this configuration example, the first auxiliary coating layer 20a and auxiliary main wiring layer 30a are formed using the same materials and under the same film forming conditions as in the forming method for the second embodiment. Also, the first auxiliary sub-coating layer 54a is formed as a Ti sputter film using sputtering that targets Ti. The second auxiliary sub-coating film 56a is formed as a TiN film using sputtering, using the same materials and under the same film forming conditions used in the forming method for the first embodiment.

In this configuration example, in a preferable situation, the Ti sputter film is formed under the following conditions: a film depth of 30 nm; pressure of 4 mTorr (approximately 0.532 Pa); and power of 1.5 kW. Here also, argon is used for the sputter injection ions.

A Ti film is formed as the first auxiliary sub-coating layer 54a because it adheres well and also has a hydrogen occlusion characteristic. Therefore, any hydrogen that attempts to pass through this film can be captured within the Ti film. In addition, hydrogen in the metal interlayer insulation film is believed to be another cause of degradation of the ferroelectric substance characteristic and it is therefore hoped that provision of this Ti film will shut out hydrogen from the interlayer insulation film.

Figure 7C:
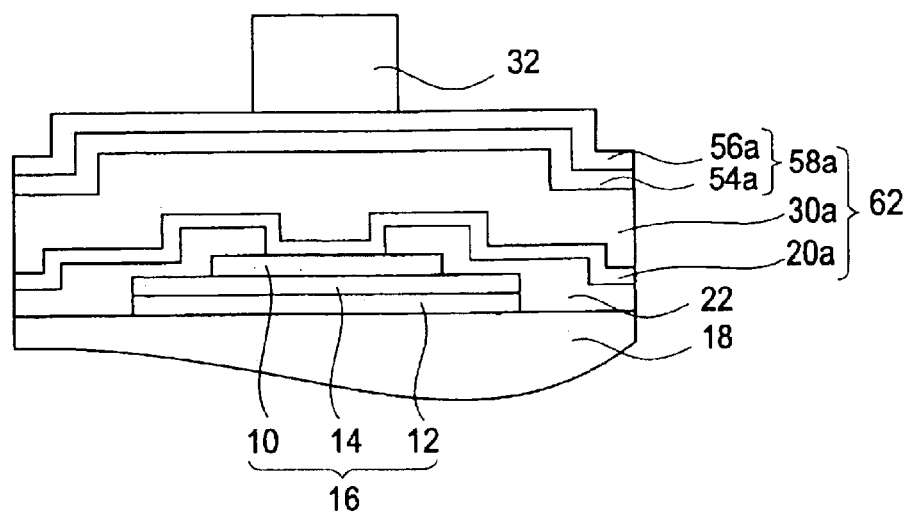

Next, in the third sub-process, photolithography is used to form a first resist pattern 32 on the auxiliary built-up layer 62 (FIG. 7(C)). The resist material used here is the same as that used in the forming method for the first embodiment and this first resist pattern 32 is formed under photolithography conditions.

Figure 7D:
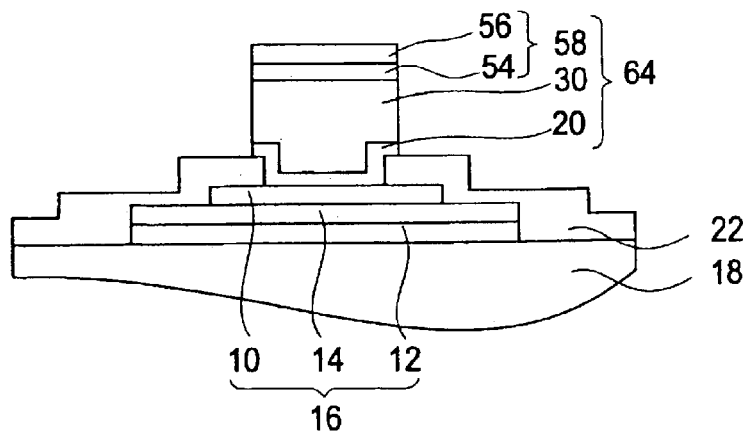

Next, in the fourth sub-process, the auxiliary built-up layer 46 is etched to form a first built-up layer 52 (FIG. 7(D)). Here also, as in the forming method for the first embodiment, the first mask pattern 32 is used as a mask and a TiN film 56a, Ti film 54a, Al film 30a, and TiN film 20a are etched sequentially. The sputter film 58, comprising the films of the first sub-coating part (Ti film) and second sub-coating part (TiN film) 56, is formed as a second coating part, an Al wiring layer 30 as the main wiring layer, and a TiN sputter film 20 as the first coating part. Each is formed to an appropriate shape and size. Here, etching of the TiN film and Al film is done in the same gas atmosphere as in the forming method for the first embodiment and under the same etching conditions. The first resist pattern is then removed in an appropriate manner.

Next, a preferable example of the second process will be explained.

Figure 7E:
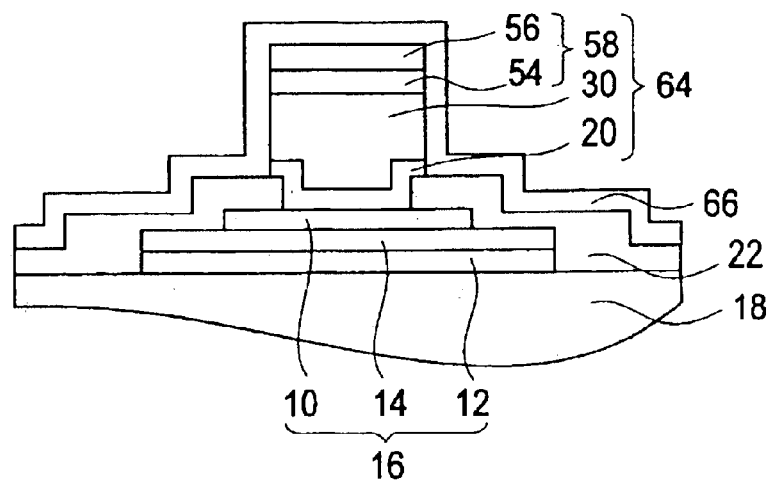

In the fifth sub-process, a third auxiliary coating layering 66 is formed on the interlayer insulation film 22 that includes the first built-up layer 64 (FIG. 7(E)). As with the second auxiliary coating film 34 in the forming method for the first embodiment, this third auxiliary coating layer 66 is formed using TiN CVD technique and film forming conditions. This CVD enables TiN film of a uniform depth to be formed on the upper and side surfaces of the first built-up layer 64.

Next, in the sixth sub-process, as in the forming method for the second embodiment, anisotropic etching of the third auxiliary coating layer 66 is implemented from a direction perpendicular to expose the upper surfaces of both the second coating part (TiN film 56 here) 58 and inter-layer insulation film 22. In addition, the third coating part 40 is formed (FIG. 7(F)). The etching used here is dry etching and total surface etch back is implemented from the third auxiliary coating layer 66 side. The dry etching of the TiN film using CVD is implemented in the same gas atmosphere as etching in the forming method for the first embodiment and under the same etching conditions. Therefore, the third auxiliary coating layer 66 on the side of the first built-up layer 64 is not removed by this etching, and therefore the coating layer 80 can be obtained.

In this way, the wiring layer structure 300, which is connected to an electrode on a ferroelectric capacitor and in which the outside of the main wiring layer 30 is coated with coating layer 80 as required, is obtained.

Thus, in the forming method for the wiring layer structure for the third embodiment, a TiN film 20 is formed on the underside of the main wiring layer 30, a laminated film comprising Ti film 54 and TiN film 56 is provided on the upper side of the main wiring layer 30, and a first built-up layer 64 is provided. A new TiN film 66 is then provided from the upper side of this first built-up layer 64 over all surfaces of the interlayer insulation film 22. Dry etching of this TiN film 66 etches back all surfaces to obtain the wiring layer structure.

Therefore, the upper part of the main wiring layer and the TiN film on parts of the surrounding area are removed by etching but part of the third auxiliary coating layer 66 formed on the side of the first built-up layer 64 in a direction perpendicular to the surface of the substrate is not removed. This fact means that the lithography process is simplified and a coating layer 80 can be properly formed around the required surfaces of the main wiring layer.

Forming Method for the Configuration for the Fourth Embodiment

In this forming method, an outside layer is further added to the upper side of the CVD-Ti film (inside film) on the side of the wiring layer structure of the third embodiment described above.

In the forming method for this fourth embodiment, the wiring layer structure is formed using the same processes up to the sixth sub-process of the second process in the forming method for the third embodiment described above. A wiring layer structure as shown in FIG. 7(F) is thus formed.

Figure 7F:
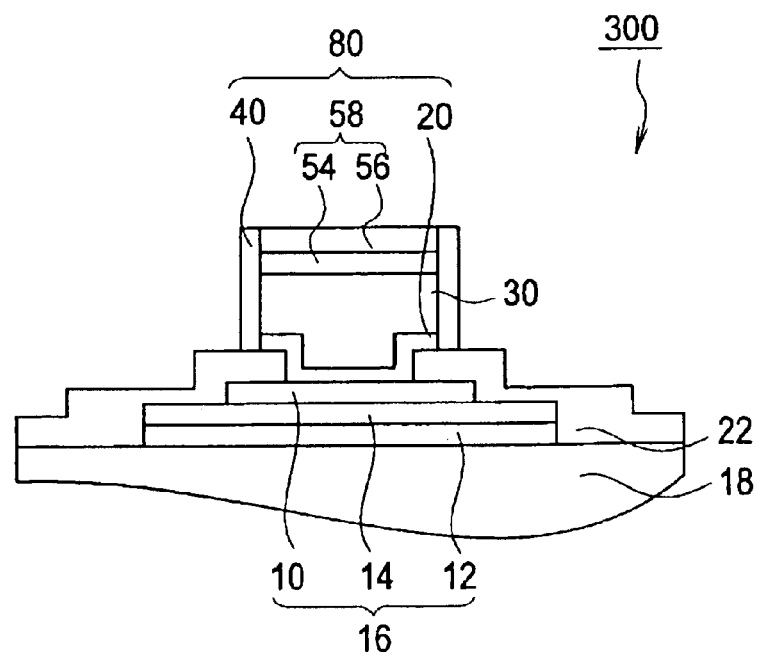
Figure 8A:
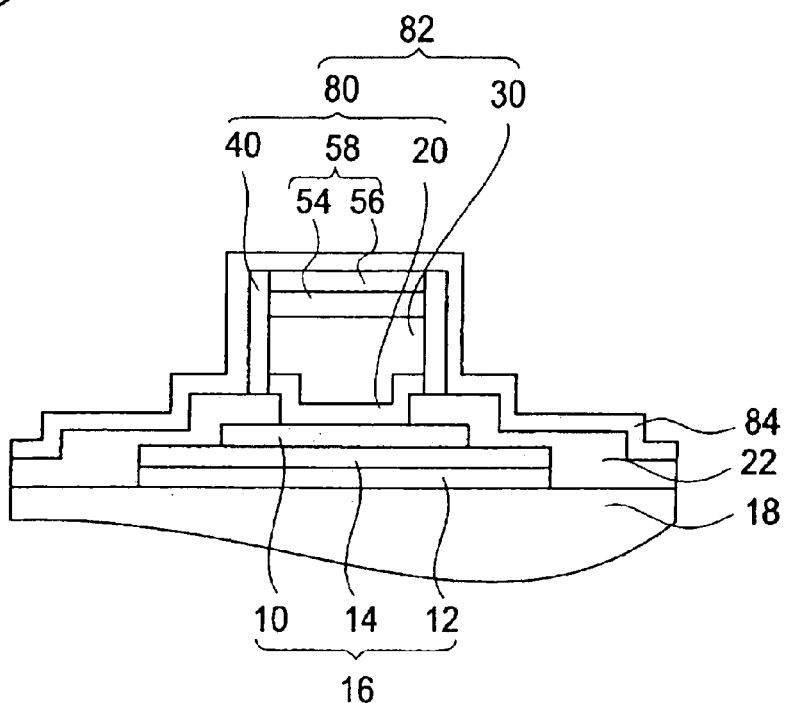
FIG. 8 (including FIGS. 8(A) and 8(F)) shows the processes involved in the formation of the structure of a fourth aspect of the embodiment of the wiring layer structure of the present invention.
Figure 8B:
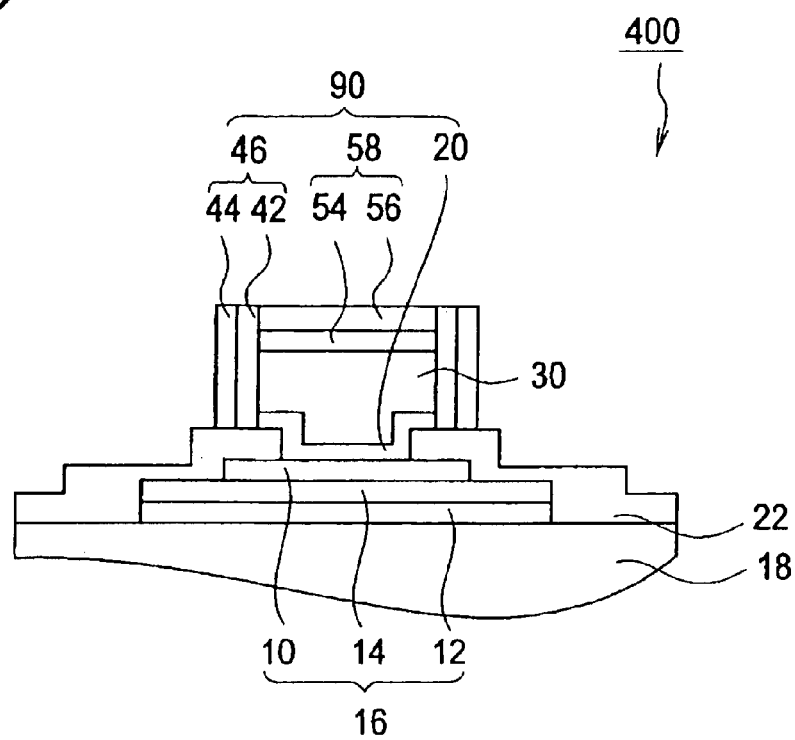

FIGS. 8(A) and (B) continue on from FIG. 7(F) and are process drawings that accompany the explanation of the overview of the forming method for the fourth embodiment. In the forming method for this fourth embodiment, the structure in which the main wiring layer 30 and coating layer 80 shown in FIG. 7(F) are combined is called the second built-up layer 82.

In the forming method for this fourth embodiment, in the seventh sub-process of the second process, a fourth auxiliary coating layer 84 is formed on the exposed interlayer insulation film 22 that includes the second built-up layer 82 (FIG. 8(A)). A TiN film is formed using the CVD method as this fourth auxiliary coating layer 84. The film forming conditions for this CVD-TiN film can be the same as those for the other CVD-TiN film 34 (FIG. 5(E)) explained previously in the forming method for the first embodiment.

Next, in the eighth sub-process, anisotropic etching of the fourth auxiliary coating layer 84 is implemented in a perpendicular direction. This etching exposes the second sub-coating part 56 of the second coating part 58 and the interlayer insulation film 22. In addition, it forms a fourth sub-coating part 44 on the side of the second built-up layer 82 (FIG. 8(B)).

Through the above processes, a third coating part 46, which comprises a third sub-coating part 42 and a fourth sub-coating part 44, is formed and a coating layer 90 for this fourth embodiment is obtained.

Thus, a wiring layer structure 400, which is connected to an electrode of the ferroelectric capacitor and in which a coating layer 90 is provided around all required parts of the main wiring layer 30, is obtained.

In this forming method for this fourth embodiment, lithography is simplified as it is in the forming method for the third embodiment, and a coating film 90 can be properly formed around the main wiring layer where required.

What is claimed is:

1. A wiring layer structure connected to a first electrode of a ferroelectric capacitor having first and second electrodes, comprising:

a main wiring layer including a first material comprised of aluminum; and a coating layer including a first coating part provided between said main wiring layer and said first electrode, a second coating part provided on the top surface of said main wiring layer, and a third coating part covering side faces of said main wiring layer, said coating layer encapsulates said main wiring layer;

wherein said first material reacts with a substance to produce a reducing agent, said substance being infiltrated from the outside to this main wiring layer, and said coating layer is conductive and comprises a second material for preventing the infiltration of said substance into said main wiring layer.

2. The wiring layer structure according to claim 1, wherein said second material is titanium nitride (TiN).

3. The wiring layer structure according to claim 1, wherein said second material is titanium (Ti).

4. The wiring layer structure according to claim 1, wherein said second material is titanium nitride (TiN) and titanium (Ti).

5. The wiring layer structure according to claim 1, wherein said first, second, and third coating parts are titanium nitride (TiN) films.

6. The wiring layer structure according to claim 1, wherein said first and third coating parts are titanium nitride (TiN) films, and said second coating part is a built-up film composed of a titanium (Ti) film and a titanium nitride (TiN) film.

7. The wiring layer structure according to claim 1, wherein said first coating part is a titanium nitride (TiN) film, and wherein said second and third coating parts are built-up films composed of a titanium (Ti) film and a titanium nitride (TiN) film.

8. The wiring layer structure according to claim 1, wherein said first coating part is a titanium nitride (TiN) sputtering film, and said second and third coating parts are TiN-CVD films.

9. The wiring layer structure according to claim 1, wherein said first and second coating parts are TiN-sputtering films, and said third coating part is a TiN-CVD film.

10. The wiring layer structure according to claim 1, wherein said first coating part is a TiN-sputtering film, said second coating part is a built-up film composed of a Ti-sputtering film and a TiN-sputtering film, and said third coating part is a TiN-CVD film.

11. The wiring layer structure according to claim 1, wherein said first coating part is a TiN-sputtering film, said second coating part is a built-up film formed from a Ti-sputtering film and a TiN-sputtering film, and said third coating part is a built-up film formed from a Ti-CVD film and a TiN-CVD film.

12. The wiring layer structure according to claim 1, wherein said substance infiltrating from the outside is either water ($H_2O$) or hydrogen ($H_2$).

13. The wiring layer structure according to claim 1, wherein said reducing agent is either a hydrogen radical ($H^*$) or hydrogen ($H_2$).

* * * * *